(12) United States Patent
Hong et al.

(10) Patent No.: US 10,937,710 B2
(45) Date of Patent: Mar. 2, 2021

(54) ELECTRONIC COMPONENT MODULE

(71) Applicant: Samsung Electro-Mechanics Co., Ltd., Suwon-si (KR)

(72) Inventors: Suk Youn Hong, Suwon-si (KR); Han Su Park, Suwon-si (KR); Jong Woo Choi, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/655,331

(22) Filed: Oct. 17, 2019

(65) Prior Publication Data

US 2020/0395260 A1    Dec. 17, 2020

(30) Foreign Application Priority Data

Jun. 13, 2019  (KR) .................. 10-2019-0070024

(51) Int. Cl.
*H01L 23/31*    (2006.01)
*H01L 23/552*   (2006.01)
*H01L 23/498*   (2006.01)

(52) U.S. Cl.
CPC .... *H01L 23/3121* (2013.01); *H01L 23/49822* (2013.01); *H01L 23/552* (2013.01); *H01L 2924/3025* (2013.01)

(58) Field of Classification Search
CPC ........... H01L 23/3121; H01L 23/49822; H01L 23/552; H01L 2924/3025
USPC ........................................................ 257/788
See application file for complete search history.

(56) References Cited

U.S. PATENT DOCUMENTS

2016/0262292 A1*  9/2016  Kuk ..................... H05K 3/284
2017/0278804 A1*  9/2017  Kawabata ......... H01L 23/49805
2018/0033738 A1   2/2018  Kawabata et al.

FOREIGN PATENT DOCUMENTS

| JP | 2017-174947 A    | 9/2017 |
| JP | 6328698 B2       | 5/2018 |
| KR | 10-2012-0039338 A | 4/2012 |
| KR | 10-2016-0108117 A | 9/2016 |

OTHER PUBLICATIONS

Korean Office Action dated Aug. 28, 2020 in counterpart Korean Patent Application No. 10-2019-0070024 (8 pages in English, 6 pages in Korean).

\* cited by examiner

*Primary Examiner* — Tong-Ho Kim
(74) *Attorney, Agent, or Firm* — NSIP Law

(57) ABSTRACT

An electronic component module includes a substrate; an electronic element disposed on a first surface of the substrate; an encapsulant encapsulating the electronic element; a first shielding member disposed on a first surface of the encapsulant to surround the electronic element; a second shielding member disposed on a second surface of the encapsulant and spaced apart from the first shielding member; a shielding layer covering the first shielding member and the second shielding member; and a connection member connecting the electronic element to the second shielding member.

19 Claims, 4 Drawing Sheets

ELECTRONIC COMPONENT MODULE

CROSS-REFERENCE TO RELATED APPLICATION(S)

This application claims the benefit under 35 USC 119(a) of Korean Patent Application No. 10-2019-0070024 filed on Jun. 13, 2019 in the Korean Intellectual Property Office, the entire disclosure of which is incorporated herein by reference for all purposes.

BACKGROUND

1. Field

The following description relates to an electronic component module.

2. Description of Background

In the market for electronic products, demand for portable devices has rapidly increased. In order to satisfy such demand, the miniaturization and lightening of electronic elements mounted in the systems are required.

In order to realize the miniaturization and lightening of such electronic elements, not only a technique of reducing the individual sizes of the mounting components, but also a system on chip (SOC) technique of making a plurality of discrete elements into a single chip, a system in package (SIP) technique of integrating individual elements into one package, or the like are required.

In particular, a high frequency electronic component module that handles a high frequency signal such as a communications module or a network module is required to have various electromagnetic wave shielding structures in order to realize not only miniaturization but also good shielding properties against electromagnetic interference (EMI).

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An electronic component module capable of improving electromagnetic wave shielding performance and heat dissipation performance.

In one general aspect, an electronic component module includes a substrate; an electronic element disposed on a first surface of the substrate; an encapsulant encapsulating the electronic element; a first shielding member disposed on a first surface of the encapsulant to surround the electronic element; a second shielding member disposed on a second surface of the encapsulant and spaced apart from the first shielding member; a shielding layer covering the first shielding member and the second shielding member; and a connection member connecting the electronic element to the second shielding member.

The connection member may include a first connection member disposed on a first surface of the electronic element, and a second connection member disposed on a first surface of the first connection member and connected to the second shielding member.

The first connection member may include a metal material.

An area of a portion of the second connection member adjacent to the first connection member may be smaller than an area of a portion of the second connection member adjacent to the second shielding member.

The second connection member may include a polymer material containing a conductive metal.

The connection member may be embedded in the encapsulant.

The substrate may include a ground pad connected to the first shielding member on the first surface of the substrate.

The first shielding member may be thicker than the second shielding member.

The shielding layer may be disposed on at least a portion of a side surface of the substrate.

The connection member may include a metal material.

The shielding member may include a polymer material containing a conductive metal.

In another general aspect, an electronic component module includes a substrate; an electronic element disposed on a first surface of the substrate; an encapsulant encapsulating the electronic element; shielding members disposed on at least two surfaces of the encapsulant; a connection member disposed on a first surface of the electronic element; and a shielding layer covering the shielding members. The shielding members include a first shielding member disposed on a surface of the encapsulant normal to the first surface of the substrate, and a second shielding member connected to the connection member and including an end portion protruding from the encapsulant. The first shielding member and the second shielding member are spaced apart from each other.

An area of a portion of the second shielding member adjacent to the connection member may be smaller than an area of a portion of the second shielding member adjacent to the shielding layer.

The shielding members may include a polymer material containing a conductive metal.

The second shielding member may include a plate portion protruding from the encapsulant.

The connection member may include a metal material.

In another general aspect, an electronic component module includes a substrate; an electronic element disposed on a first surface of the substrate and encapsulated in an encapsulant; a first shielding member disposed on a first surface of the encapsulant; a second shielding member separated from the first shielding member and disposed on a second surface of the encapsulant that is normal to the first surface of the encapsulant; and a connection member disposed between electronic element and the second shielding member.

A portion of the second shielding member may be embedded in the encapsulant.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
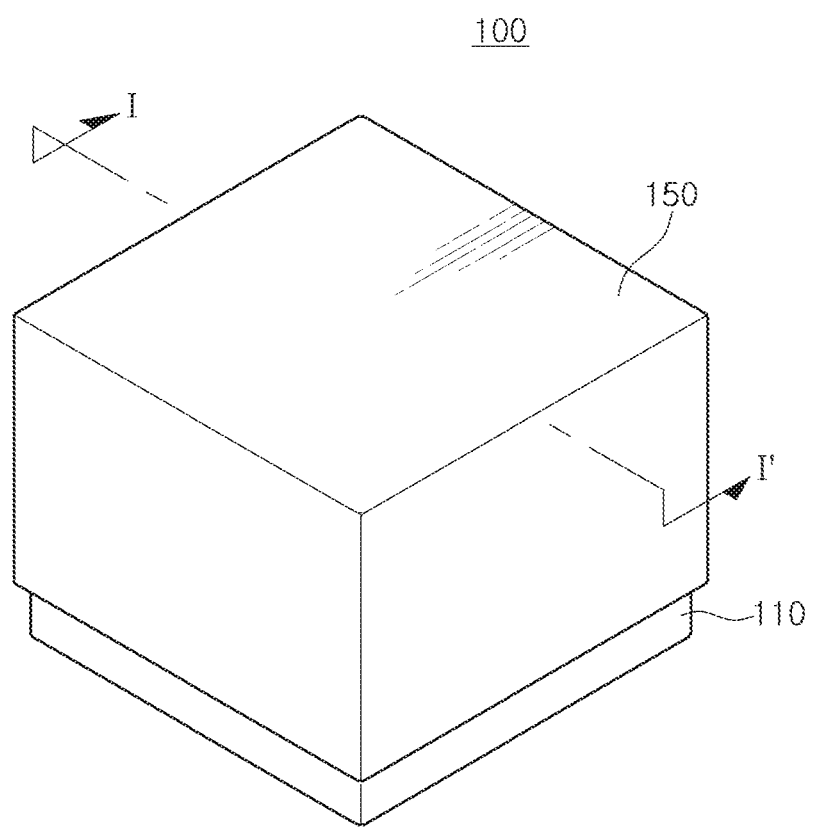
FIG. 1 is a perspective view of an electronic component module according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
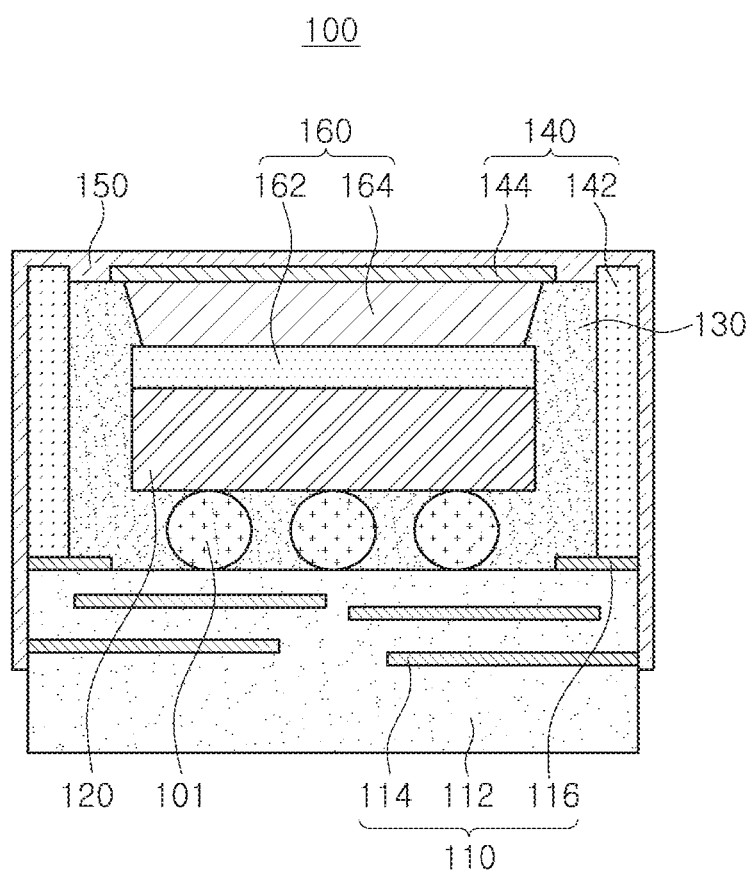
FIG. 2 is a cross-sectional view taken along line I-I' of FIG. 1.

FIG. 1 is a perspective view of an electronic component module according to an example, and FIG. 2 is a cross-sectional view taken along line I-I' of FIG. 1.

Referring to FIGS. 1 and 2, an electronic component module 100 may include a substrate 110, an electronic element 120, an encapsulant 130, shielding members 140, a shielding layer 150, and a connection member 160.

The substrate 110 may be a multilayer substrate in which a plurality of insulation layers 112 and a plurality of wiring layers 114 are repeatedly stacked. The substrate 110 may be formed as a double-sided substrate having wiring layers 114 formed on both surfaces of one insulation layer 112. For example, as the substrate 110, various types of substrates (for example, a printed circuit board, a flexible substrate, a ceramic substrate, a glass substrate, or the like) well known in the art may be used.

A material of the insulation layers 112 is not particularly limited. For example, a thermosetting resin such as an epoxy resin, a thermoplastic resin such as a polyimide, or a photosensitive insulating resin, or a resin impregnated with a core material such as glass fiber, glass cloth, glass fabric, or the like, together with an inorganic filler, for example, an insulating material such as prepreg, Ajinomoto Build-up Film (ABF), FR-3, a bismaleimide triazine (BT) film, a photoimageable dielectric (PID) film, or the like, may be used.

The wiring layer 114 may be electrically connected to the electronic element 120.

As a material of the wiring layer 114, a conductive material such as copper (Cu), aluminum (Al), silver (Ag), tin (Sn), gold (Au), nickel (Ni), lead (Pb), titanium (Ti), or alloys thereof may be used.

An insulating protective layer may be disposed on a surface of the substrate 110. The insulating protective layer may be formed of a solder resist, and may be disposed on upper and lower surfaces of the insulation layer 112 to cover both the insulation layer 112 and the wiring layer 114.

The substrate 110 may include a first surface, and a second surface opposite to the first surface. The first surface refers to a surface on which the electronic element 120 may be mounted, and the second surface refers to a surface facing a main substrate, when the electronic component module 100 is mounted on the main substrate.

A mounting electrode (not illustrated) for mounting the electronic element 120 may be disposed on the first surface of the substrate 110. A connection electrode (not illustrated) for connecting a connection terminal (not illustrated) such as a solder ball may be disposed on the second surface of the substrate 110. Also, at least one of the mounting electrodes may be used as a ground electrode (not illustrated).

A ground pad 116 may be disposed on an upper surface (first surface) of the substrate 110. The ground pad 116 may be electrically connected to the ground electrode.

The electronic element 120 may be disposed on one surface of the substrate 110. The electronic element 120 may be at least one of a variety of elements, such as an active element and a passive element. For example, all elements or components that may be mounted on the substrate 110 may be used as the electronic element 120.

The electronic element 120 may include an element to allow electromagnetic waves to be emitted, or to be protected from electromagnetic waves emitted from the outside during operations.

The electronic element 120 may be mounted on the substrate 110 with a plurality of solder balls 101.

The encapsulant 130 may encapsulate the electronic element 120. The encapsulant 130 may fix the electronic element 120 in an externally surrounding manner, to securely protect the electronic element 120 from external impacts.

The encapsulant 130 may be formed of an insulating material. For example, the encapsulant 130 may be formed of a resin material such as an epoxy molding compound (EMC), but is not limited to such a material. Further, the encapsulant 130 may be formed with a material (e.g., a conductive resin, or the like) having conductivity, as necessary. In this case, a separate encapsulant such as an underfill resin may be provided between the electronic element 120 and the substrate 110.

The shielding members 140 may include a first shielding member 142 disposed on a side surface of the encapsulant 130 to surround the electronic element 120, and a second shielding member 144 disposed on an upper surface of the encapsulant 130 and spaced apart from the first shielding member 142. The shielding members 140 may be made of a polymer material containing a conductive metal. As an example, the conductive metal may be a metal having a relatively high electrical conductivity such as copper (Cu), aluminum (Al), silver (Ag), tin (Sn), gold (Au), nickel (Ni), lead (Pb), titanium (Ti), or the like, and the polymer material may be an epoxy-based synthetic resin. As described above, since the shielding members 140 may be made of a polymer material containing a conductive metal, the breakage of the encapsulant 130 may be reduced due to a difference in thermal expansion coefficients between each of the shielding members 140 and the encapsulant 130. Furthermore, since the shielding members 140 are disposed on the side surface and the upper surface of the encapsulant 130, the heat dissipation efficiency may be improved and the electromagnetic wave shielding effect may be enhanced.

The first shielding member 142 and the second shielding member 144 may be arranged to be spaced apart from each other, to prevent breakage of the first shielding member 142 and the second shielding member 144 due to stress. For example, when the first and second shielding members 142 and 144 are connected, the first and second shielding members 142 and 144 may be cracked due to stress in a region in which the first and second shielding members 142 and 144 are connected. Since the first and second shielding members 142 and 144 are arranged to be spaced apart from each other, the breakage due to stress may be prevented.

The first shielding member 142 may be connected to the ground pad 116 of the substrate 110.

The first shielding member 142 may be thicker than the second shielding member 144.

The shielding layer 150 may be disposed to cover the shielding members 140. The shielding layer 150 may shield electromagnetic waves that flow into the electronic element 120 from the outside or flow out from the electronic element 120 to the outside. The shielding layer 150 may be formed of a conductive material, and may be connected to the ground pad 116 of the substrate 110 via the first shielding member 142. The shielding layer 150 may be formed to cover a portion of the side surface of the substrate 110.

The shielding layer 150 may be provided by applying a resin material containing conductive powder to an outer surface of the encapsulant 130 or by forming a metal thin film on the outer surface of the encapsulant 130. Various techniques such as a sputtering process, a screen printing process, a vapor deposition process, an electrolytic plating process, and a non-electrolytic plating process may be used to form a metal thin film.

For example, the shielding layer 150 may be a metal thin film formed on the outer surface of the encapsulant 130 by a spray coating process. The spray coating process may be advantageous in that a uniform coated film is formed and the cost for equipment investment is less than those of other processes. The process is not limited thereto, and a metal thin film formed by a sputtering process may be also used.

The shielding members 140 and the shielding layer 150 may be formed by separate manufacturing processes. Therefore, the shielding members 140 and the shielding layer 150 may be made of different materials, but may be also made of the same material, as necessary.

The shielding members 140 and the shielding layer 150 may serve to prevent peeling of the encapsulant 130.

The connection member 160 may connect the electronic element 120 and the second shielding member 144. The connection member 160 may include a first connection member 162 disposed on an upper surface of the electronic element 120, and a second connection member 164 disposed on an upper surface of the first connection member 162 and connected to the second shielding member 144. The first connection member 162 may be made of a metal material, and may be disposed to extend from the upper surface of the electronic element 120. The first connection member 162 may serve to shield electromagnetic waves, and to emit heat generated by the electronic element 120. Further, the first connection member 162 may serve as a stop layer in laser processing. The second connection member 164 may be formed of a polymer material containing a conductive metal. As an example, the conductive metal may be a metal having a relatively high electrical conductivity such as copper (Cu), aluminum (Al), silver (Ag), tin (Sn), gold (Au), nickel (Ni), lead (Pb), titanium (Ti), or the like, and the polymer material may be an epoxy-based synthetic resin. An area of a lower end portion of the second connection member 164 may be smaller than an area of an upper end portion of the second connection member 164. Therefore, the heat dissipation characteristic of the second connection member 164 may be improved.

As described above, the heat dissipation characteristics and the electromagnetic wave shielding performance may be improved due to the shielding members 140 and the connection member 160.

Hereinafter, a modified example of an electronic component module will be described with reference to the drawings. However, the constituent elements described above may be denoted by the same reference numerals, and a detailed description thereof will be omitted.

Figure 3:
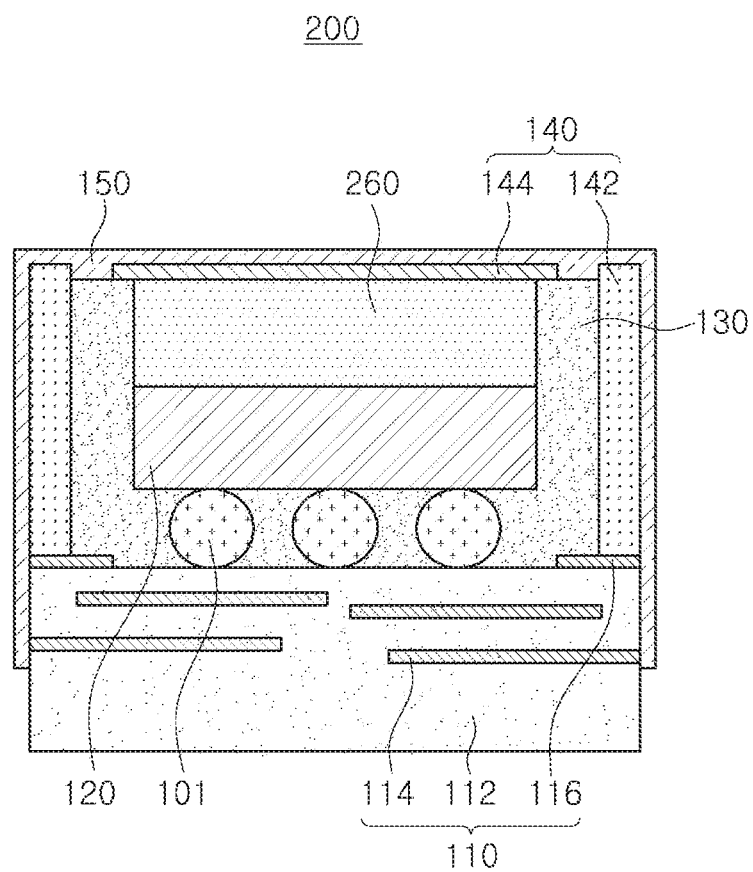
FIG. 3 is a cross-sectional view illustrating a modified example of an electronic component module.

FIG. 3 is a cross-sectional view illustrating a modified example of an electronic component module.

Referring to FIG. 3, an electronic component module 200 may include a substrate 110, an electronic element 120, an encapsulant 130, shielding members 140, a shielding layer 150, and a connection member 260.

The substrate 110, the electronic element 120, the encapsulant 130, the shielding members 140, and the shielding layer 150 may be the same components as those described with respect to FIG. 2.

The connection member 260 may connect the electronic element 120 and a second shielding member 144. The connection member 260 may be made of a metal material, and may be disposed to extend from an upper surface of the electronic element 120. Therefore, the connection member 260 may improve the heat dissipation characteristics of the electronic component module 200. As an example, the connection member 260 may have a hexahedral shape.

Figure 4:
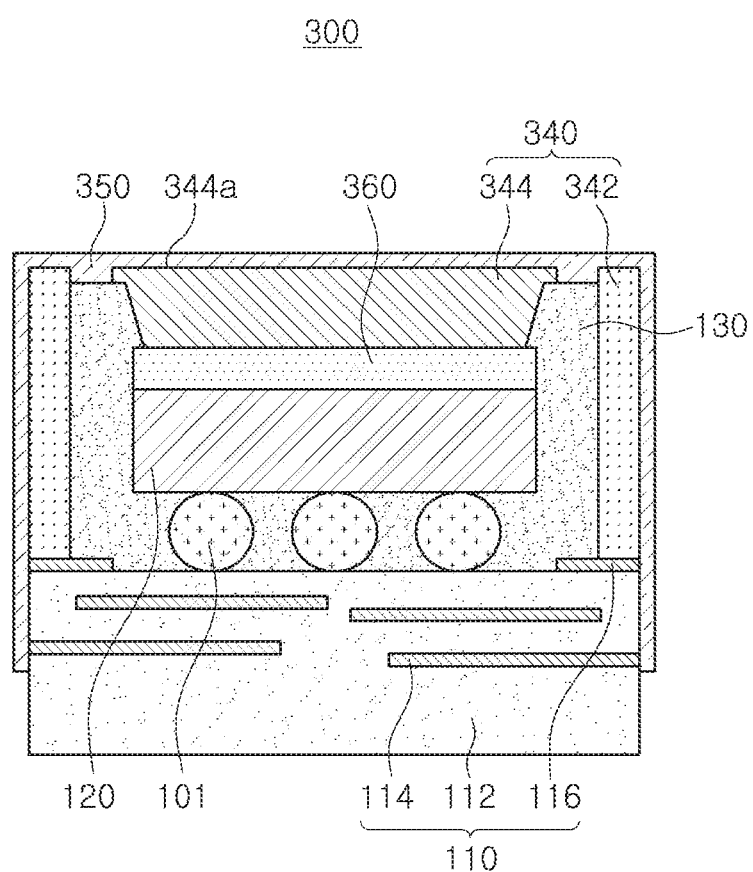
FIG. 4 is a cross-sectional view illustrating a modified example of an electronic component module.

FIG. 4 is a cross-sectional view illustrating a modified example of an electronic component module.

Referring to FIG. 4, an electronic component module 300 may include a substrate 110, an electronic element 120, an encapsulant 130, shielding members 340, a shielding layer 350, and a connection member 360.

The substrate 110, the electronic element 120, and the encapsulant 130 may be the same components as those described in FIGS. 2 and 3, and a detailed description thereof will be omitted and be read as those described above.

The shielding members 340 may be disposed on side and upper surfaces of the encapsulant 130. The shielding members 340 may include a first shielding member 342 disposed on a side surface of the encapsulant 130, and a second shielding member 344 disposed to extend from the connection member 360 and having an end portion embedded in the shielding layer 350.

The first shielding member 342 and the second shielding member 344 may be arranged to be spaced apart from each other.

The shielding members 340 may be made of a polymer material containing a conductive metal. As an example, the conductive metal may be a metal having a relatively high electrical conductivity such as copper (Cu), aluminum (Al), silver (Ag), tin (Sn), gold (Au), nickel (Ni), lead (Pb), titanium (Ti), or the like, and the polymer material may be an epoxy-based synthetic resin. As described above, since the shielding members 340 may be made of a polymer material containing a conductive metal, the breakage of the encapsulant 130 may be reduced due to a difference in thermal expansion coefficients between each of the shielding members 340 and the encapsulant 130. Furthermore, since the shielding members 340 are disposed on the side surface and the upper surface of the encapsulant 130, the heat dissipation efficiency may be improved and the electromagnetic wave shielding effect may be enhanced.

The first shielding member 342 and the second shielding member 344 may be arranged to be spaced apart from each other, to prevent breakage of the first shielding member 342 and the second shielding member 344 due to stress. For example, when the first and second shielding members 342 and 344 are connected, the first and second shielding members 342 and 344 may be cracked due to stress in a region in which the first and second shielding members 342 and 344 are connected. Since the first and second shielding members 342 and 344 are arranged to be spaced apart from each other, the breakage due to stress may be prevented.

The first shielding member 342 may be connected to the ground pad 116 of the substrate 110.

A plate portion 344a embedded in the shielding layer 350 may be provided in an end portion of the second shielding member 344. For example, remaining portion of the second shielding member 344, except for the plate portion 344a, may be embedded in the encapsulant 130, and the plate portion 344a may be embedded in the shielding layer 350. An area of the plate portion 344a (length) may be larger than an area of the remaining portion of the second shielding member 344. Therefore, the heat dissipation characteristics may be further improved.

The shielding layer 350 may be disposed to cover the shielding members 340. The shielding layer 350 may shield electromagnetic waves that flow into the electronic element 120 from the outside or flow out from the electronic element 120 to the outside. The shielding layer 350 may be formed of a conductive material, and may be connected to the ground pad 116 of the substrate 110 via the first shielding member 342. The shielding layer 350 may be formed to cover a portion of the side surface of the substrate 110.

The shielding layer 350 may be provided by applying a resin material containing conductive powder to an outer surface of the encapsulant 130 or by forming a metal thin film on the outer surface of the encapsulant 130. Various techniques such as a sputtering process, a screen printing process, a vapor deposition process, an electrolytic plating process, and a non-electrolytic plating process may be used to form a metal thin film.

For example, the shielding layer 350 may be a metal thin film formed on the outer surface of the encapsulant 130 by a spray coating process. The spray coating process may be advantageous in that a uniform coated film is formed and the cost for equipment investment is less than those of other processes. The process is not limited thereto, and a metal thin film formed by a sputtering process may be also used.

The shielding members 340 and the shielding layer 350 may be formed by separate manufacturing processes. Therefore, the shielding members 340 and the shielding layer 350 may be made of different materials, but may be also made of the same material, as necessary.

The shielding members 340 and the shielding layer 350 may serve to prevent peeling of the encapsulant 130.

The connection member 360 may connect the electronic element 120 and the second shielding member 344. The connection member 360 may be made of a metal material, and may be disposed to extend from an upper surface of the electronic element 120. Therefore, the connection member 360 may improve the heat dissipation characteristics. As an example, the connection member 360 may have a hexahedral shape.

The electromagnetic wave shielding performance and the heat dissipation performance of the electronic component module may be improved.

Further, the breakage of the shielding member in the electronic component module may be reduced.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic component module comprising:
a substrate;
an electronic element disposed on a first surface of the substrate;
an encapsulant completely encapsulating the electronic element;
a first shielding member disposed on a first surface of the encapsulant to surround the electronic element;
a second shielding member disposed on a second surface of the encapsulant and spaced apart from the first shielding member;
a shielding layer covering the first shielding member and the second shielding member; and
a connection member connecting the electronic element to the second shielding member.

2. The electronic component module according to claim 1, wherein the connection member comprises a first connection member disposed on a first surface of the electronic element, and a second connection member disposed on a first surface of the first connection member and connected to the second shielding member.

3. The electronic component module according to claim 2, wherein the first connection member comprises a metal material.

4. The electronic component module according to claim 2, wherein an area of a portion of the second connection member adjacent to the first connection member is smaller than an area of a portion of the second connection member adjacent to the second shielding member.

5. The electronic component module according to claim 2, wherein the second connection member comprises a polymer material containing a conductive metal.

6. The electronic component module according to claim 2, wherein the connection member is embedded in the encapsulant.

7. The electronic component module according to claim 1, wherein the substrate comprises a ground pad connected to the first shielding member on the first surface of the substrate.

8. The electronic component module according to claim 1, wherein the first shielding member is thicker than the second shielding member.

9. The electronic component module according to claim 1, wherein the shielding layer is disposed on at least a portion of a side surface of the substrate.

10. The electronic component module according to claim 1, wherein the connection member comprises a metal material.

11. The electronic component module according to claim 1, wherein the shielding member comprises a polymer material containing a conductive metal.

12. An electronic component module comprising:
a substrate;
an electronic element disposed on a first surface of the substrate;
an encapsulant completely encapsulating the electronic element;
shielding members disposed on at least two surfaces of the encapsulant;
a connection member disposed on a first surface of the electronic element; and
a shielding layer covering the shielding members,
wherein the shielding members comprise a first shielding member disposed on a surface of the encapsulant normal to the first surface of the substrate, and a second shielding member connected to the connection member and comprising an end portion protruding from the encapsulant, and
the first shielding member and the second shielding member are spaced apart from each other.

13. The electronic component module according to claim 12, wherein an area of a portion of the second shielding member adjacent to the connection member is smaller than an area of a portion of the second shielding member adjacent to the shielding layer.

14. The electronic component module according to claim 12, wherein the first and second shielding members comprise a polymer material containing a conductive metal.

15. The electronic component module according to claim 12, wherein the second shielding member comprises a plate portion protruding from the encapsulant.

16. The electronic component module according to claim 12, wherein the connection member comprises a metal material.

17. An electronic component module comprising:
a substrate;
an electronic element disposed on a first surface of the substrate and completely encapsulated in an encapsulant;
a first shielding member disposed on a first surface of the encapsulant;
a second shielding member separated from the first shielding member and disposed on a second surface of the encapsulant that is normal to the first surface of the encapsulant; and
a connection member disposed between electronic element and the second shielding member.

18. The electronic component module according to claim 17, wherein a portion of the second shielding member is embedded in the encapsulant.

19. An electronic component module comprising:
a substrate;
an electronic element disposed on a first surface of the substrate;
an encapsulant encapsulating the electronic element;
a first shielding member disposed on a first surface of the encapsulant to surround the electronic element;
a second shielding member disposed on a second surface of the encapsulant and spaced apart from the first shielding member;
a shielding layer covering the first shielding member and the second shielding member; and
a connection member embedded in the encapsulant and connecting the electronic element to the second shielding member.

* * * * *